United States Patent
Doris et al.

(10) Patent No.: US 9,876,074 B2
(45) Date of Patent: Jan. 23, 2018

(54) STRUCTURE AND PROCESS TO TUCK FIN TIPS SELF-ALIGNED TO GATES

(71) Applicant: INTERNATIONAL BUSINESS MACHINES CORPORATION, Armonk, NY (US)

(72) Inventors: Bruce B. Doris, Slingerlands, NY (US); Hong He, Schenectady, NY (US); Sivananda K. Kanakasabapathy, Niskayuna, NY (US); Gauri Karve, Cohoes, NY (US); Fee Li Lie, Albany, NY (US); Derrick Liu, Albany, NY (US); Soon-Cheon Seo, Glenmont, NY (US); Stuart A. Sieg, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 63 days.

(21) Appl. No.: 14/719,829

(22) Filed: May 22, 2015

(65) Prior Publication Data
US 2016/0343861 A1   Nov. 24, 2016

(51) Int. Cl.
*H01L 29/06* (2006.01)
*H01L 29/78* (2006.01)
*H01L 29/66* (2006.01)

(52) U.S. Cl.
CPC .... *H01L 29/0649* (2013.01); *H01L 29/66795* (2013.01); *H01L 29/785* (2013.01); *H01L 29/66545* (2013.01)

(58) Field of Classification Search
CPC ............ H01L 29/7856; H01L 29/0649; H01L 29/66545; H01L 29/6656; H01L 29/66795
See application file for complete search history.

(56) References Cited

U.S. PATENT DOCUMENTS

| | | | |
|---|---|---|---|
| 7,176,092 B2 | 2/2007 | Yeo et al. | |
| 8,791,509 B2 | 7/2014 | Beyer et al. | |
| 8,912,603 B2* | 12/2014 | Luning | H01L 29/66795 257/288 |
| 8,980,701 B1* | 3/2015 | Lu | H01L 29/66795 438/151 |

(Continued)

FOREIGN PATENT DOCUMENTS

| | | |
|---|---|---|
| CN | 1716542 A | 1/2006 |
| CN | 102292799 A | 12/2011 |

(Continued)

OTHER PUBLICATIONS

International Search Report and Written Opinion dated Sep. 8, 2016, received in a corresponding foreign application.

*Primary Examiner* — Cheung Lee
*Assistant Examiner* — Stephen C Smith
(74) *Attorney, Agent, or Firm* — Scully, Scott, Murphy & Presser, P.C.; Steven J. Meyers (57) ABSTRACT

A semiconductor structure is provided that includes a semiconductor fin portion having an end wall and extending upward from a substrate. A gate structure straddles a portion of the semiconductor fin portion. A first set of gate spacers is located on opposing sidewall surfaces of the gate structure; and a second set of gate spacers is located on sidewalls of the first set of gate spacers. One gate spacer of the second set of gate spacers has a lower portion that directly contacts the end wall of the semiconductor fin portion.

12 Claims, 8 Drawing Sheets

(56) References Cited

U.S. PATENT DOCUMENTS

| | | | |
|---|---|---|---|
| 9,129,988 B1* | 9/2015 | Lee | H01L 29/66545 |
| 9,419,106 B2 | 8/2016 | Joshi et al. | |
| 2011/0266622 A1* | 11/2011 | Luning | H01L 29/66795 |
| | | | 257/347 |
| 2012/0018730 A1 | 1/2012 | Kanakasabapathy et al. | |
| 2013/0065371 A1 | 3/2013 | Wei et al. | |
| 2013/0277746 A1 | 10/2013 | Baldauf et al. | |
| 2014/0191296 A1 | 7/2014 | Bergendahl et al. | |
| 2014/0357040 A1* | 12/2014 | Loubet | H01L 29/66795 |
| | | | 438/299 |
| 2015/0014773 A1 | 1/2015 | Cheng et al. | |
| 2015/0132909 A1 | 5/2015 | Choi et al. | |

FOREIGN PATENT DOCUMENTS

| | | |
|---|---|---|
| CN | 103858215 A | 6/2014 |
| CN | 104637820 A | 5/2015 |

\* cited by examiner

STRUCTURE AND PROCESS TO TUCK FIN TIPS SELF-ALIGNED TO GATES

The present application relates to a semiconductor structure and a method of forming the same. More particularly, the present application relates to a semiconductor structure that contains semiconductor fin tips (i.e., ends) that are tucked in a self-aligned manner inside a gate structure and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. FinFETs can increase the on-current per unit area relative to planar field effect transistors.

In prior art processes, semiconductor fins are first provided and then the semiconductor fins are cut using a patterning process. Gate structures are then formed straddling each of the cut semiconductor fins and thereafter gate spacers are formed. In such processing, the semiconductor fin tips (i.e., the ends of the cut semiconductor fins) are tucked under one of the gate structures and there is typically one gate spacer that does not physically tuck the semiconductor fin tip and any error in the relative positioning of the gate to the fin tip could result in a gate spacer that does not physically tuck the semiconductor fin tip. In such instances, and during formation of source/drain regions by epitaxial growth a "rogue epitaxial semiconductor material portion" may form from the non-tucked semiconductor fin tip. This problem becomes greater as the critical dimensions (CDs) of the gate structure and gate pitches becomes smaller and smaller.

In addition to the above, prior art processing of tucking the semiconductor fins beneath a gate structure can produce free surfaces that cause pre-stressed substrates to relax and hence loose mobility enhancement.

In view of the above problems with prior art processes of tucking semiconductor fin tips beneath the gate structure, there is a need for providing a new method that is capable of tucking semiconductor fins beneath the gate structure while avoiding or reducing the problems associated with prior art processing.

SUMMARY

In one aspect of the present application, a semiconductor structure is provided. In one embodiment of the present application, the semiconductor structure includes a semiconductor fin portion having an end wall and extending upwards from a substrate. A gate structure straddles a portion of the semiconductor fin portion. A first set of gate spacers (i.e., inner gate spacers) is located on opposing sidewall surfaces of the gate structure; and a second set of gate spacers (i.e., outer gate spacers) is located on sidewalls of the first gate spacers. One of the gate spacers of the second set of gate spacers has a lower portion that directly contacts the end wall of the semiconductor fin portion.

In another aspect of the present application, a method of forming a semiconductor structure is provided. In one embodiment, the method may include forming a gate structure straddling a semiconductor fin. Next, a dielectric material is formed on the semiconductor fin and at least on the sidewalls of the gate structure and thereafter a patterned material stack having an opening is formed over the dielectric material. The semiconductor fin is then cut utilizing the patterned material stack and a portion of the dielectric material within the opening as an etch mask to provide a semiconductor fin portion containing the gate structure and having an exposed end wall. Gate spacers are then formed, wherein one of the gate spacers contains a lower portion that directly contacts the exposed end wall of the semiconductor fin portion.

In another embodiment, the method may include forming a gate structure straddling a portion of a semiconductor fin. Next, a first set of gate spacers is formed on opposing sidewalls of the gate structure and straddling another portion of the semiconductor fin and, thereafter, a sacrificial dielectric liner is formed over the first set of gate spacers and the gate structure and straddling a remaining portion of the semiconductor fin. A patterned material stack having an opening is formed over the sacrificial dielectric liner. The semiconductor fin is then cut utilizing the patterned material stack, a portion of the sacrificial dielectric liner within the opening and one gate spacer of the first set of gate spacers as an etch mask to provide a semiconductor fin portion containing the gate structure and having an end wall. A lateral etch is then performed to pull back the end wall of the semiconductor fin portion underneath or vertically aligned to the one gate spacer of the first set of gate spacers within the opening. Next, a second set of gate spacers is formed, wherein one gate spacer of the second set of gate spacers contains a lower portion that directly contacts the exposed end wall of the semiconductor fin portion.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
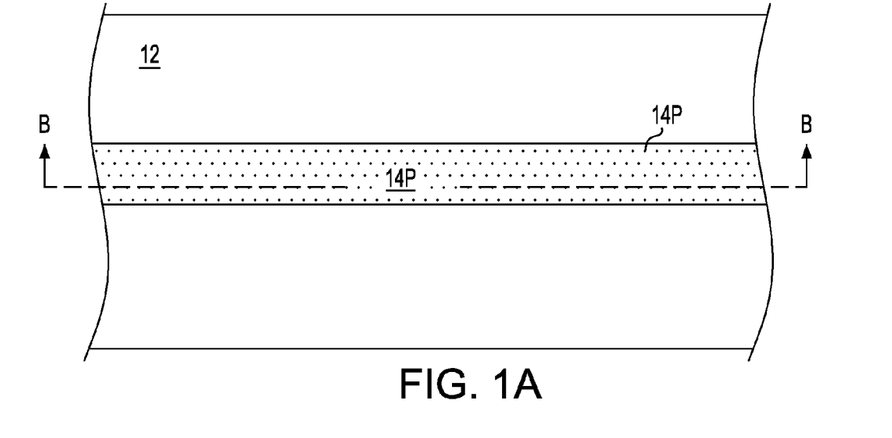
FIG. 1A is a top down view of an exemplary semiconductor structure after forming a semiconductor fin on a surface of a substrate in accordance with an embodiment of the present application.
Figure 1B:
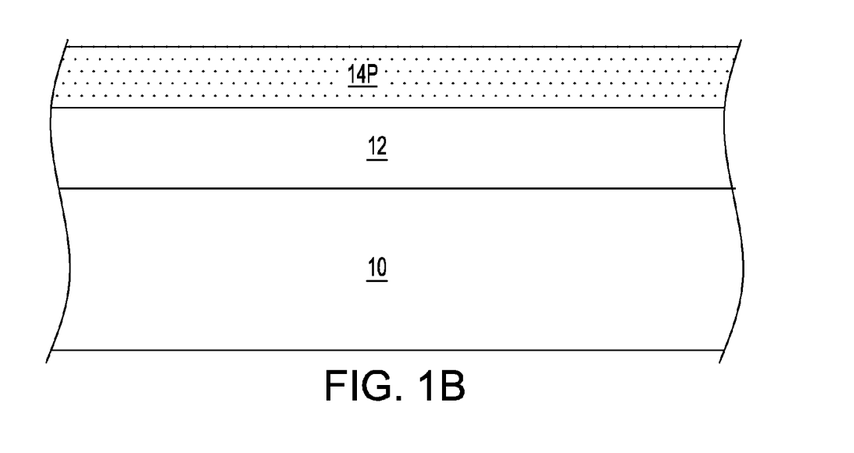
FIG. 1B is a vertical cross sectional view of the exemplary semiconductor structure along vertical plane B-B of FIG. 1A.

Referring now to FIGS. 1A-1B, there are illustrated various views of an exemplary semiconductor structure after forming a semiconductor fin 14P on a surface of a substrate in accordance with an embodiment of the present application. Although a single semiconductor fin 14P is described and illustrated, the present application contemplates embodiments in which a plurality of semiconductor fins 14P can be formed on different portions of the substrate. In such an embodiment, each semiconductor fin is orientated parallel to each other.

In one embodiment of the present application, and as shown, the substrate comprises, from bottom to top, a handle substrate 10 and an insulator layer 12. In yet another embodiment (not shown), the substrate comprises a remaining portion of a bulk semiconductor substrate. The term "bulk" when used in conjunction with the phrase "semiconductor substrate" denotes that the entire substrate is composed of at least one semiconductor material.

The exemplary semiconductor structure shown in FIGS. 1A-1B can be formed by first providing a bulk semiconductor substrate or a semiconductor-on-insulator (SOI) substrate. When a bulk semiconductor substrate is employed in the present application, the at least one semiconductor material that provides the bulk semiconductor substrate can include, but is not limited to, Si, Ge, SiGe, SiC, SiGeC, III/V compound semiconductors such as, for example, InAs, InP, InAsP, and GaAs, and II/VI compound semiconductor materials. In such an embodiment, a topmost semiconductor material layer portion of the bulk semiconductor substrate can be used as each semiconductor fin 14P, while the remaining portion of the bulk semiconductor substrate can be used as the substrate. In some embodiments of the present application, the bulk semiconductor substrate may be a single crystalline semiconductor material. In other embodiments of the present application, the bulk semiconductor substrate may be a polycrystalline semiconductor material or an amorphous semiconductor material. The crystal orientation of the bulk semiconductor substrate may be {100}, {110}, or {111}. Other crystallographic orientations besides those specifically mentioned can also be used in the present application.

When an SOI substrate is employed, the SOI substrate includes from, bottom to top, the handle substrate 10, the insulator layer 12, and a topmost semiconductor layer. The topmost semiconductor layer of the SOI substrate will provide the semiconductor fin 14P of the structure shown in FIGS. 1A-1B. In some embodiments of the present application, the handle substrate 10 and the topmost semiconductor layer of the SOI substrate may comprise a same semiconductor material. In other embodiments of the present application, the handle substrate 10 and the topmost semiconductor layer of the SOI substrate may comprise a different semiconductor material. The semiconductor material(s) that can be used as the handle substrate 10 and the topmost semiconductor layer includes one of the semiconductor materials mentioned above for the bulk semiconductor substrate. In one embodiment, the handle substrate 10 and the topmost semiconductor layer of the SOI substrate are both comprised silicon. In some embodiments, the handle substrate 10 is a non-semiconductor material including, for example, a dielectric material and/or a conductive material.

The handle substrate 10 and the topmost semiconductor layer of the SOI substrate may have the same or different crystal orientation including any of those mentioned above for the bulk semiconductor substrate. The handle substrate 10 and/or the topmost semiconductor layer of the SOI substrate may be a single crystalline semiconductor material, a polycrystalline material, or an amorphous material. Typically, at least the topmost semiconductor layer of the SOI substrate is a single crystalline semiconductor material.

The insulator layer 12 of the SOI substrate may be a crystalline or non-crystalline oxide or nitride. In one embodiment, the insulator layer 12 is an oxide such as, for example, silicon dioxide.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of topmost semiconductor layer of the SOI substrate is typically from 10 nm to 100 nm, although other thicknesses that are lesser than, or greater than, the aforementioned thickness range may also be used for the thickness of the topmost semiconductor layer of the SOI substrate. The insulator layer 12 of the SOI substrate typically has a thickness from 1 nm to 200 nm, although other thicknesses that are lesser than, or greater than, the aforementioned thickness range for the insulator layer 12 of the SOI substrate can be used. The thickness of the handle substrate 10 of the SOI substrate is inconsequential to the present application.

In some embodiments of the present application, a hard mask layer (not shown) can be formed on a topmost surface of either the bulk semiconductor substrate or the SOI substrate. The hard mask layer that can be employed is a contiguous layer that covers the entirety of the topmost surface of the bulk semiconductor substrate or the SOI substrate. The hard mask layer that can be employed in the present application may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments of the present application, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 50 nm to 50 nm, although other thickness that are lesser than, or greater, than the aforementioned thickness range can be used for the hard mask layer.

Next, the bulk semiconductor substrate or the SOI substrate, with or without the hard mask layer, can be patterned to provide the semiconductor fin 14P shown in FIGS. 1A-1B. In one embodiment, the patterning process used to define the semiconductor fin 14P may include a sidewall image transfer (SIT) process. The SIT process includes forming a contiguous mandrel material layer (not shown) on the topmost surface of the hard mask layer, the bulk semiconductor substrate or the SOI substrate. The contiguous mandrel material layer (not shown) can include any material (semiconductor, dielectric, conductive or organic) that can be selectively removed from the structure during a subsequently performed etching process. In one embodiment, the contiguous mandrel material layer (not shown) may be composed of amorphous silicon, amorphous carbon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer can be used to determine the width of each semiconductor fin 14P.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor material that provides the semiconductor fin 14P. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In some embodiments, lithography and etching can be used to define the semiconductor fin. Lithography includes depositing a photoresist material (not shown) atop the bulk semiconductor substrate or SOI substrate, patterning the photoresist material by exposing the photoresist material to a desired pattern of irradiation, and developing the exposed photoresist material utilizing a conventional resist developer. Etching may include dry etching (i.e., reactive ion etching, ion beam etching, plasma etching, or laser ablation) or a chemical wet etch process. Following the formation of the semiconductor fin 14P, the patterned photoresist material can be removed utilizing a resist stripping process such as, for example, ashing.

In some embodiments and following formation of the semiconductor fin 14P, the hard mask material can be removed from atop the semiconductor fin 14P by a planarization process or by etching. In other embodiments (not shown), the hard mask material can remain atop each semiconductor fin 14P that is formed.

As used herein, a "semiconductor fin" refers to a contiguous semiconductor structure that extends upward from a surface of a substrate. In one embodiment, the substrate includes insulator layer 12 and handle substrate 10. In other embodiments, the substrate is a remaining portion of a bulk semiconductor substrate. Each fin structure that is formed includes a pair of vertical sidewalls that are parallel to each other. As used herein, a surface is "vertical" if there exists a vertical plane from which the surface does not deviate by more than three times the root mean square roughness of the surface.

Figure 2A:
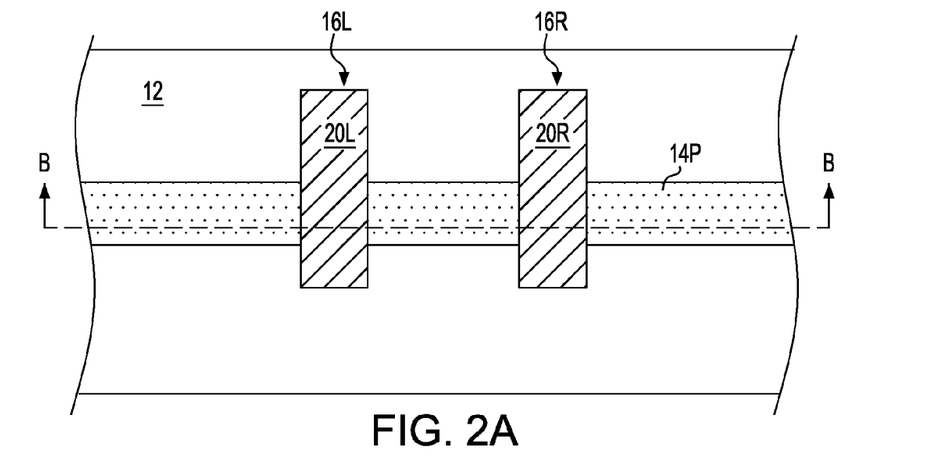
FIG. 2A is a top down view of the exemplary semiconductor structure of FIG. 1A after forming gate structures straddling over different portions of the semiconductor fin.
Figure 2B:
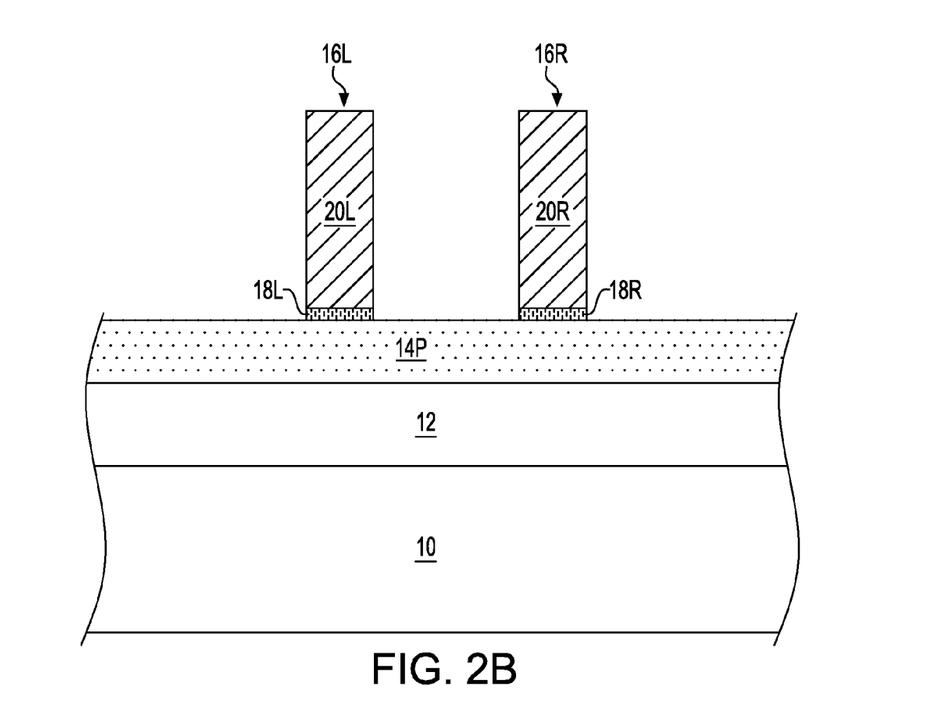
FIG. 2B is a vertical cross sectional view of the exemplary semiconductor structure along vertical plane B-B of FIG. 2A.

Referring now to FIGS. 2A-2B, there are illustrated various views of the exemplary semiconductor structure of FIGS. 1A-1B after forming gate structures 16L, 16R straddling over different portions of the semiconductor fin 14P. The term "straddling" denotes that each gate structure 16L, 16R is formed across a semiconductor fin 14P such that a first portion of each gate structure 16L, 16R is present on one side of the semiconductor fin 14P, and a second portion of each gate structure 16L, 16R is present on another side of the semiconductor fin 14P. Portions of each gate structure 16L, 16R are also located on an exposed portion of the substrate (in the illustrated embodiment, the gate structures 16L, 16R include portions that are present on insulator layer 12).

In some embodiments of the present application, and as shown, gate structures 16L, 16R are functional gate structures. By "functional gate structures" it is meant a permanent gate structure used to control output current (i.e., flow of carriers in the channel) of a semiconducting device through electrical or magnetic fields. Each functional gate structure 16L, 16R that is formed includes a gate material stack of, from bottom to top, a gate dielectric portion 18L, 18R, a gate conductor portion 20L, 20R and a gate cap portion (not shown). In some embodiments, the gate cap portion can be omitted.

Each gate dielectric portion 18L, 18R comprises a gate dielectric material. The gate dielectric material that provides each gate dielectric portion 18L, 18R can be an oxide, nitride, and/or oxynitride. In one example, the gate dielectric material that provides each gate dielectric portion 18L, 18R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as each gate dielectric portion 18L, 18R.

The gate dielectric material used in providing each gate dielectric portion 18L, 18R can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 18L, 18R. In some embodiments, each gate dielectric portion 18L, 18R comprises a same gate dielectric material. In other embodiments, gate dielectric portion 18L may comprise a first gate dielectric material, while gate dielectric portion 18R may comprise a second gate dielectric material that differs in composition from the first gate dielectric material. When a different gate dielectric material is used for the gate dielectric portions 18L, 18R, block mask technology can be used. In one embodiment of the present application, the gate dielectric material used in providing each gate dielectric portion 18L, 18R can have a thickness in a range from 1 nm to 10 nm. Other thicknesses that are lesser than, or greater than, the aforementioned thickness range can also be employed for the gate dielectric material.

Each gate conductor portion 20L, 20R comprises a gate conductor material. The gate conductor material used in providing each gate conductor portion 20L, 20R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 20L, 20R may comprise an nFET gate metal. In other embodiments, each gate conductor portion 20L, 20R may comprise a pFET gate metal. In yet other embodiments, gate conductor portion 20L comprises an nFET gate metal, while gate conductor portion 20R comprises a pFET gate metal. In yet another embodiment, gate conductor portion 20L comprises a pFET gate metal, while gate conductor portion 20R comprises an nFET gate metal.

The gate conductor material used in providing each gate conductor portion 20L, 20R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions 20L, 20R, block mask technology can be used. In one embodiment, the gate conductor material used in providing each gate conductor portion 20L, 20R has a thickness from 1 nm to 100 nm. Other thicknesses that are lesser than, or greater than, the aforementioned thickness range can also be employed for the gate conductor material used in providing each gate conductor portion 20L, 20R.

Each gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, the gate structures 16L, 16R are sacrificial gate structures. By sacrificial gate structure" it is meant a material or material stack that serves as a placeholder for a subsequently formed functional gate structure. In such a process, the functional gate structure is formed after semiconductor fin cutting by replacing the sacrificial gate structure with a functional gate structure as defined above. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for gate dielectric portions 18L, 18R. The sacrificial gate material portion includes one of the gate conductor materials mentioned above for gate conductor portions 20L, 20R. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

Figure 3:
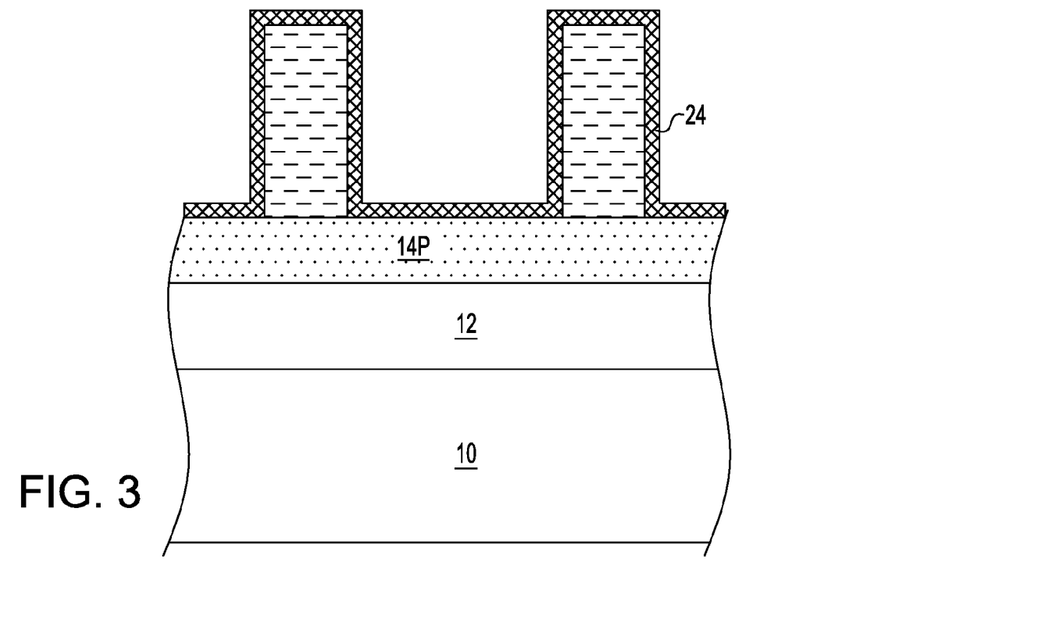
FIG. 3 is a cross sectional view of the exemplary semiconductor structure of FIGS. 2A-2B after forming a dielectric material liner.

In the drawings that follow only the vertical cross sectional of the exemplary semiconductor structure along vertical plane B-B is shown. Vertical plane B-B is a plane that is in present through the semiconductor fin 14P. Referring now to FIG. 3, there is illustrated the exemplary semiconductor structure of FIGS. 2A-2B after forming a dielectric material liner 24. As is shown, dielectric material liner 24 is a conformal layer that covers exposed surfaces of the semiconductor fin 14P and each gate structure 16L, 16R. The dielectric material liner 24 may comprise any dielectric material including, for example, a dielectric material oxide, dielectric material nitride and/or dielectric material oxynitride. In one embodiment, the dielectric material liner 24 can be comprised of silicon dioxide. In another embodiment, the dielectric material liner 24 can be comprised of silicon nitride. In yet another embodiment, the dielectric material liner 24 can be a stack comprised of, in any order, silicon dioxide and silicon nitride. In a further embodiment, the dielectric material liner 24 may comprise a SiBCN or a SiOCN material.

In some embodiments of the present application, dielectric material liner 24 can be formed by a deposition process such as, for example, chemical vapor deposition (CVD), atomic layer deposition (ALD) or plasma enhanced chemical vapor deposition (PECVD). The thickness of dielectric material liner 24 can range from 2 nm to 10 nm, although other thickness that are lesser than, or greater, than the aforementioned thickness range can be used for the dielectric material liner 24.

In some embodiments (not shown), the dielectric material liner 24 may be etched at this point of the present application to form gate spacers (i.e., a first set of gate spacers described below) on the vertical sidewalls of each gate structures 16L, 16R. In one embodiment, the etch used to provide the first set of gate spacers may include a reactive ion etch. In such an embodiment, the dielectric material liner 24 would be removed from the topmost surface of each gate structure 16L, 16R as well as from the topmost horizontal surface of the semiconductor fin 14P.

Figure 4:
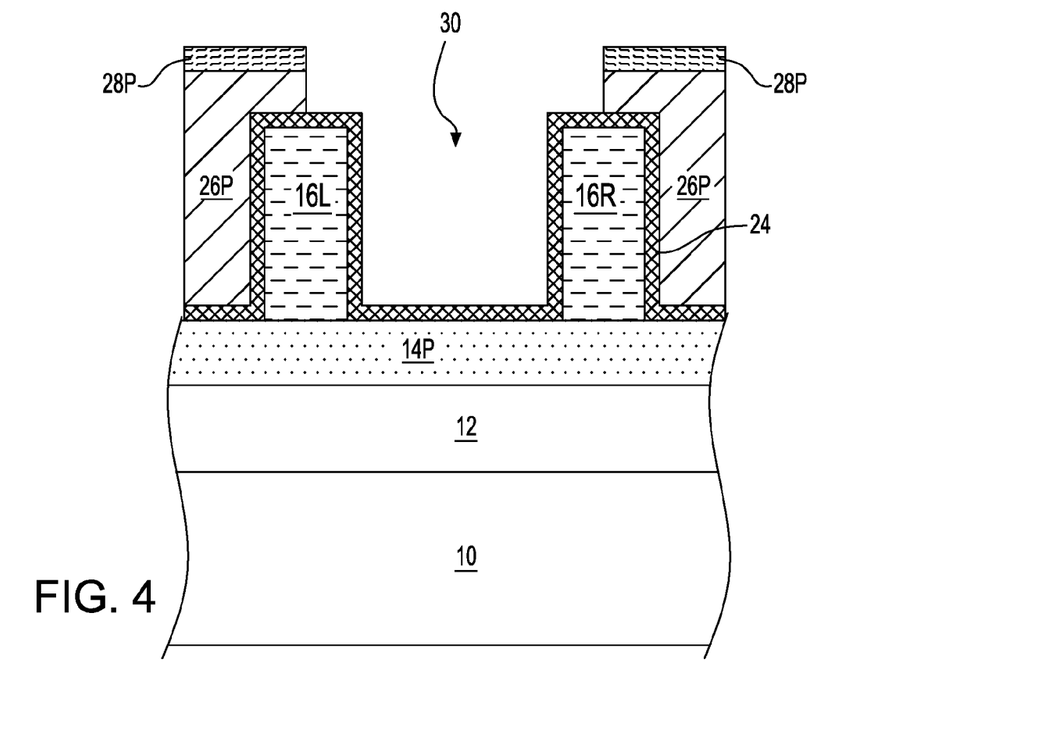
FIG. 4 is a cross sectional view of the exemplary semiconductor structure of FIG. 3 after forming a patterned material stack.

Referring now to FIG. 4, there is illustrated the exemplary semiconductor structure of FIG. 3 after forming a patterned material stack. The patterned material stack includes an opening 30 that is located between gate structure 16L and gate structure 16R. Opening 30 defines a region in which the semiconductor fin 14P will be subsequently cut. In accordance with the present application, a portion of opening 30 lands atop each gate structure 16L, 16R.

In one embodiment of the present application, the patterned material stack includes, from bottom to top, an optical planarization layer portion 26P and an antireflective coating portion 28P. A photoresist material portion (not shown) can be present atop each antireflective coating portion 28P.

The optical planarization layer (OPL) portion 26P of the patterned material stack that can be employed in the present application comprises a self-planarizing material. In one example, the optical planarization layer portion 26P can be an organic material including C, O, and H, and optionally including Si and/or F. In another example, the optical planarization layer portion 26P can be amorphous carbon. The self-planarizating material that can provide the optical planarization layer portion 26P can be formed by spin-on coating, chemical vapor deposition, plasma enhanced chemical vapor deposition, evaporation or chemical solution deposition. The thickness of the optical planarization layer portion 26P can be from 10 nm to 300 nm, although lesser and greater thicknesses can also be employed.

The antireflective coating portion 28P of the patterned material stack comprises any antireflective coating material that can reduce image distortions associated with reflections off the surface of underlying structure. In one example, the antireflective coating portion 28P of the patterned material stack comprises a silicon (Si)-containing antireflective coating material. The antireflective coating material that provides the antireflective coating portion 28P can be formed by spin-on coating, chemical vapor deposition, plasma enhanced chemical vapor deposition, evaporation or chemical solution deposition. The thickness of the antireflective coating portion 28P can be from 10 nm to 150 nm, although lesser and greater thicknesses can also be employed.

The exemplary semiconductor structure shown in FIG. 4 can be formed by first providing a material stack of from bottom to top, a blanket layer of self-planarizing material (as defined above), a blanket layer of antireflective coating material (as defined above) and a blanket layer of a photoresist material. The blanket layer of self-planarizing material and the blanket layer of antireflective coating material can be formed utilizing one of the deposition processes mentioned above. The photoresist material that may provide the blanket layer of photoresist material may comprise a positive-tone photoresist, a negative tone-resist or a hybrid photoresist material. The blanket layer of photoresist material may be deposited utilizing one of the deposition processes mentioned above in providing the antireflective coating material. After providing such a material stack, the material stack is then patterned by lithography and etching both of which have been described above in patterning the semiconductor material to provide the semiconductor fin 14P. Following the etching process, the remaining photoresist material portions are stripped utilizing a resist stripping process such as, for example, ashing.

Figure 5:
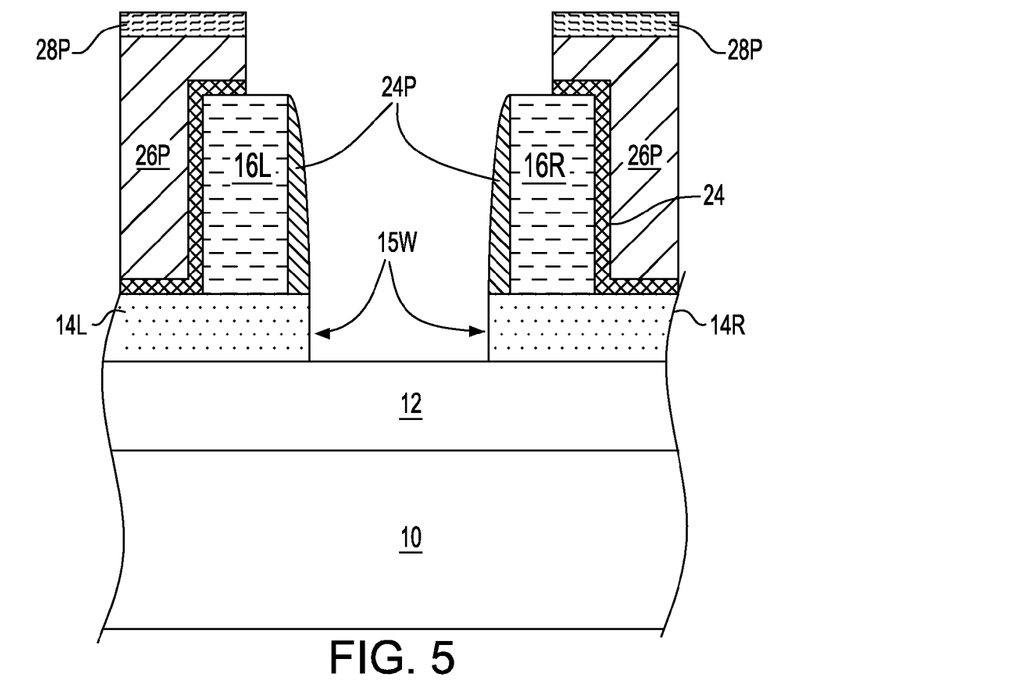
FIG. 5 is a cross sectional view of the exemplary semiconductor structure of FIG. 4 after cutting the semiconductor fin utilizing the patterned material stack and a portion of the dielectric material liner as an etch mask.

Referring now to FIG. 5, there is illustrated the exemplary semiconductor structure of FIG. 4 after cutting the semiconductor fin 14P utilizing the patterned material stack (26P, 28P) and a portion of the dielectric material liner 24 located within the opening 30 as an etch mask. The cut portions of the semiconductor fin 14P are now referred to as semiconductor fin portions 14L, 14R.

In accordance with an embodiment of the present application, the exemplary semiconductor structure shown in FIG. 5 may be formed utilizing one or more anisotropic etching process. In one example, one or more reactive ion etching processes can be used. Typically, the anisotropic etch first breaks through the exposed portions of the dielectric material liner 24 that are not protected by the patterned material stack (26P, 28P) so as to expose a horizontal topmost surface of each gate structure 16L, 16R, and then the etch continues (or a separate etch is used) to cut the semiconductor fin 14P. The 'break through' etch forms one gate spacer of the first set of gate spacers 24P along one of the sidewall surfaces of each gate structure 16L, 16R. The one gate spacer of the first set of gate spacers 24P that is formed within the opening is vertically aligned with an end wall 15W of each semiconductor fin portion 14L, 14R. In some embodiments in which the dielectric material liner was previously formed into a gate spacer, the 'break through' etch is omitted. As is shown in FIG. 5, an end wall 15W of each semiconductor fin portion 14L, 14R that is located beneath the first gate spacer of the first set of gate spacers 24P formed within the opening 30 is exposed. In accordance with the present application, the end wall 15W of semiconductor fin portion 14L faces the end wall 15W of semiconductor fin portion 14R.

Figure 6:
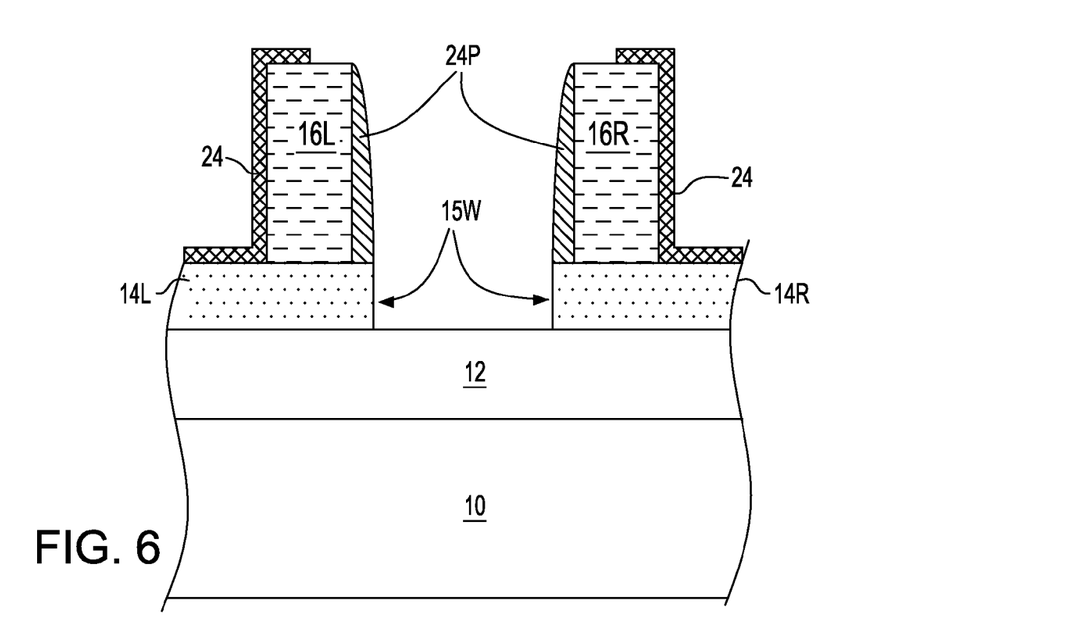
FIG. 6 is a cross sectional view of the exemplary semiconductor structure of FIG. 5 after removing the patterned material stack.

Referring now to FIG. 6, there is illustrated the exemplary semiconductor structure of FIG. 5 after removing the patterned material stack (26P, 28P). The patterned material stack (26P, 28P) may be removed by first removing the antireflective coating portion 28P by either a planarization process (such as, chemical mechanical planarization and/or grinding) or etching. The exposed OPL portion 26P can then be removed utilizing an etch back process or a strip process that is selective in removing the self-planarizing material that provides the OPL portion 26P.

After removing the patterned material stack, remaining portions of the dielectric material liner 24 can be etched to form another gate spacer of the first set of gate spacers 24P on a side of each gate structure 16L, 16R that is opposite the area in which fin cutting takes place. This step is now specifically shown.

Figure 7:
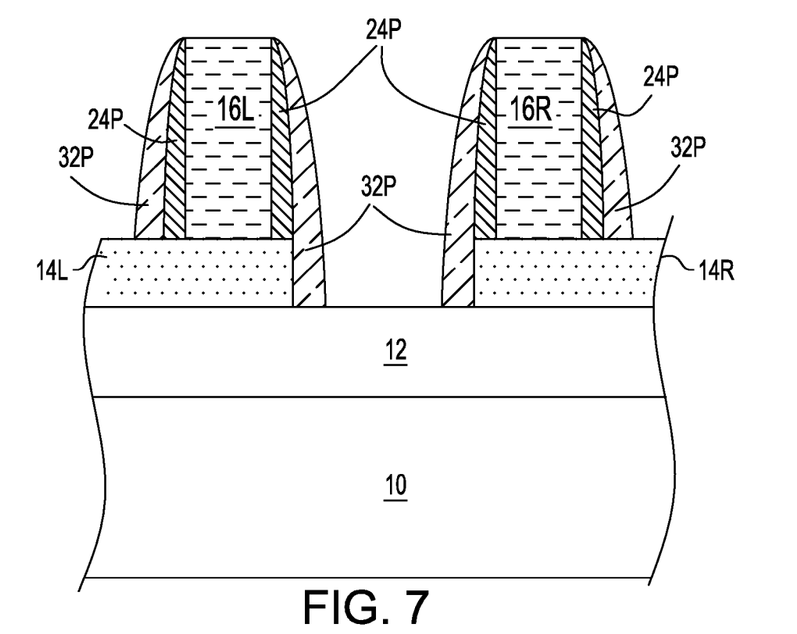
FIG. 7 is a cross sectional view of the exemplary semiconductor structure of FIG. 6 after gate spacer deposition and etching.

Referring now to FIG. 7, there is illustrated the exemplary semiconductor structure of FIG. 6 after formation of a second set of gate spacers 32P. As is shown, each gate spacer of the second set of gate spacers 32P is present on a sidewall of one gate spacer of the first set of gate spacers 24P. As is further shown, one gate spacer of the second set of gate spacers 32P covers the exposed end wall 15W of each of the semiconductor fin portions 14L, 14R. One gate spacer of the first set of gate spacers 24P and one gate spacer of the second set of gate spacers 32P that are formed on the side of the gate structure 16L, 16R opposite to which fin cutting takes place are straddling the surface of each semiconductor fin portion 14L, 14R. In the area in which fin cutting occurs, the gate spacer of the first second gate spacers 24P is straddling the surface of the semiconductor fin portion 14L, 14R, while the gate spacer of the second set of gate spacers 32P covers the exposed end wall 15W of the semiconductor fin portion 14L, 14R.

The second set of gate spacers 32P is formed by first forming a layer of a dielectric material and then performing a spacer etch. During the spacer etch and if not previously formed, the another gate spacer of the first set of gate spacers 24P is formed. The dielectric material that is used in providing the second set of gate spacers 32P may include one of the dielectric materials mentioned above for dielectric material liner 24. In one embodiment, the dielectric material that provides the second set of gate spacers 32P may comprise a same dielectric material as that used in providing the dielectric material liner 24. In one example, the dielectric material that is used in providing the second set of gate spacers 32P and the dielectric material that provides the dielectric material liner 24 both comprise silicon dioxide. In another embodiment, the dielectric material that provides the second set of gate spacers 32P may comprise a different dielectric material than that used in providing the dielectric material liner 24. In one example, the dielectric material that is used in providing the second set of gate spacers 32P comprises silicon nitride, while dielectric material that provides the dielectric material liner 24 both comprise a SiBCN or SiCON material. The dielectric material that provides the second set of gate spacers 32P can be formed utilizing one of the deposition processes mentioned above in forming the dielectric material liner 24. The spacer etch includes an anisotropic etch such as, for example, reactive ion etching.

Source/drain regions (not shown) are formed on exposed portions of the semiconductor fin portion 14L, 14R that are not covered by the gate structures 16L, 16R. The source/drain regions can be formed utilizing conventional techniques such as, for example, epitaxial growth, which are well known to those skilled in the art. As is known, the source region would be located on one side of the functional gate structure and the drain region would be located on another side of the functional gate structures. In some embodiments, the source/drain regions can be unmerged. In yet other embodiments, the source/drain regions can be merged. The source/drain regions comprise a semiconductor material and an n-type or p-type dopant. In some embodiments, the source/drain regions may comprise a same semiconductor material as that of the semiconductor fin portions 14L, 14R. In some embodiments, the source/drain regions may comprise a different semiconductor material as that of the semiconductor fin portions 14L, 14R. In some embodiments, and when a sacrificial gate structure is formed, the sacrificial gate structure can now be replaced with a functional gate structure.

Figure 8:
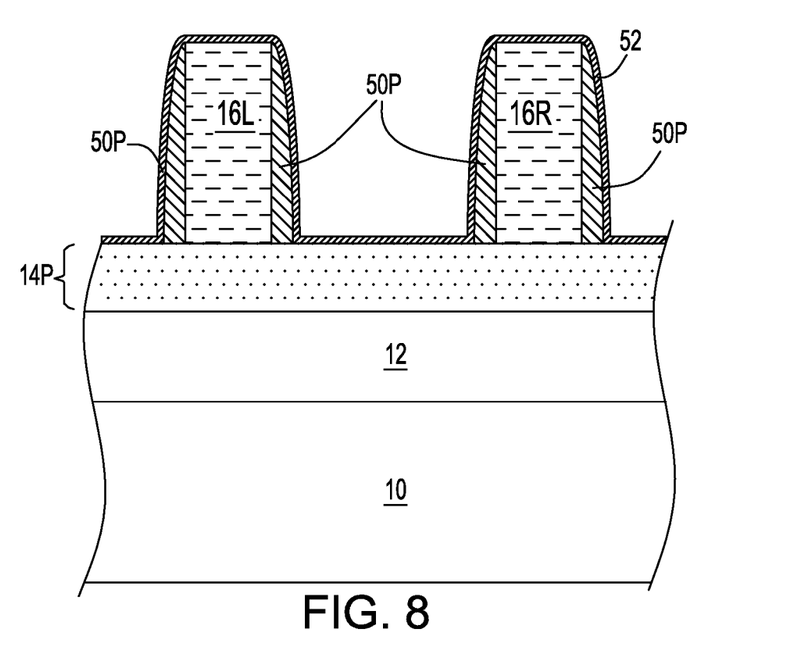
FIG. 8 is a cross sectional view of the exemplary semiconductor structure of FIG. 2B after forming a first set of gate spacers, etching, and depositing a sacrificial dielectric liner in accordance with another embodiment of the present application.

Referring now to FIG. 8, there is illustrated the exemplary semiconductor structure of FIG. 2B after forming a first set of gate spacers 50P and a sacrificial dielectric liner 52 in accordance with another embodiment of the present application.

Each gate spacer of the first set of gate spacers 50P is formed on a sidewall of each gate structure 16L, 16R. Further, the first set of gate spacers 50P is formed straddling a portion of the semiconductor 14P. The first set of gate spacers 50P can be formed by depositing a dielectric material and then performing a spacer etch. The dielectric material that can be used in providing the first set of gate spacers 50P can include one of the dielectric materials mentioned above in providing the dielectric material liner 24. In one example, the dielectric material that provides the first set of gate spacers 50P can be a SiBCN or SiOCN dielectric material. The deposition of the dielectric material that provides the first set of gate spacers 50P may comprise chemical vapor deposition, plasma enhanced chemical vapor deposition or atomic layer deposition. The spacer etch may comprise an isotropic etch such as, for example, reactive ion etching.

The sacrificial dielectric liner 52 may include one of the dielectric materials mentioned above for providing the dielectric material liner 24 so long as the selected dielectric material that is used in providing the sacrificial dielectric liner 52 has a different etch rate than the dielectric material that is used in providing the first set of gate spacers 50P. In one example, and when the first gate spacers comprise a SiBCN material, the sacrificial dielectric liner 52 may comprise silicon dioxide and/or silicon nitride. The sacrificial dielectric liner 52 would cover all exposed surfaces of the first gate spacers 50P, the topmost surface of each gate structure 16L, 16R and all exposed surfaces of the semiconductor fin 14P (not specifically seen in the cross sectional view shown). The sacrificial dielectric liner 52 can be formed utilizing a deposition process such as, for example, chemical vapor deposition, plasma enhanced chemical vapor deposition or atomic layer deposition. The sacrificial dielectric liner 52 may have a thickness from 1 nm to 20 nm. Other thickness that are lesser than, or greater than, the aforementioned thickness range may also be used as the thickness of the sacrificial dielectric liner 52.

Figure 9:
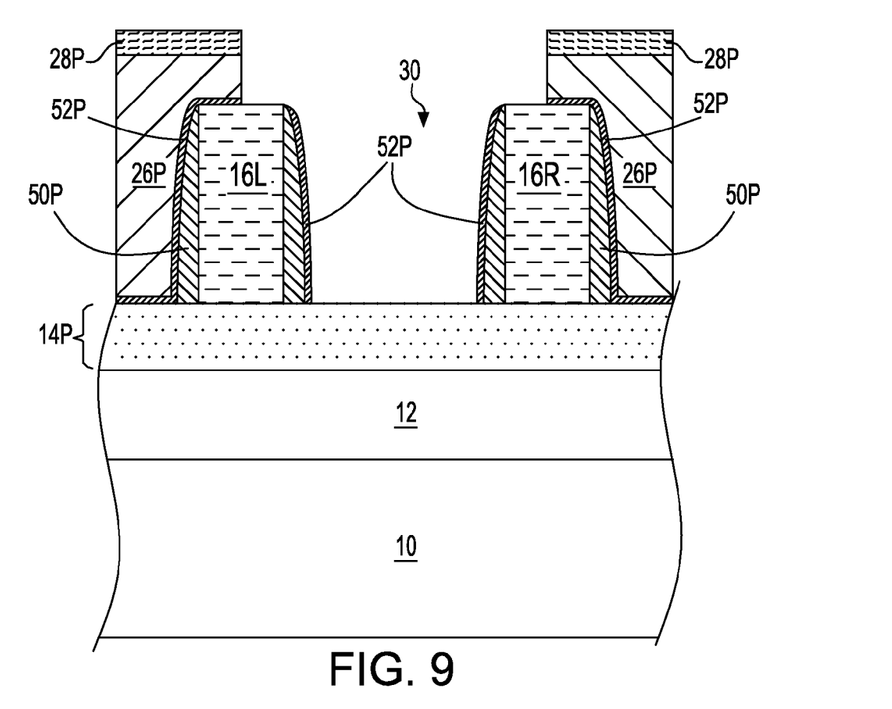
FIG. 9 is a cross sectional view of the exemplary semiconductor structure of FIG. 8 after forming a patterned material stack and performing a punch through etch of the sacrificial dielectric liner.

Referring now to FIG. 9, there is illustrated the exemplary semiconductor structure of FIG. 8 after forming a patterned material stack (26P, 28P) and performing a punch through etch of the sacrificial dielectric liner 52. As is shown, and after the punch through etch has been performed, a portion of the topmost surface of each gate structure 16L, 16R is exposed as is all surfaces of the semiconductor fin 14P that is located between the gate structures 16L, 16R. The sacrificial dielectric liner 52 that remains after the punch through etch has been performed can be referred to herein as a sacrificial dielectric liner portion 52P.

The patterned material stack (26P, 28P) used in this embodiment of the present application is the same as the patterned material stack mentioned in the previous embodiment of the present application. Thus, the patterned material stack (26P, 28P) of this embodiment of the present application includes materials and can be formed as discussed above in the previous embodiment of the present application. Element 30 represents an opening that is formed within the patterned material stack (26P, 28P) during formation of the same. The punch through etch comprises an anisotropic etch that is selective in removing the dielectric material that provides the sacrificial dielectric liner 52.

Figure 10:
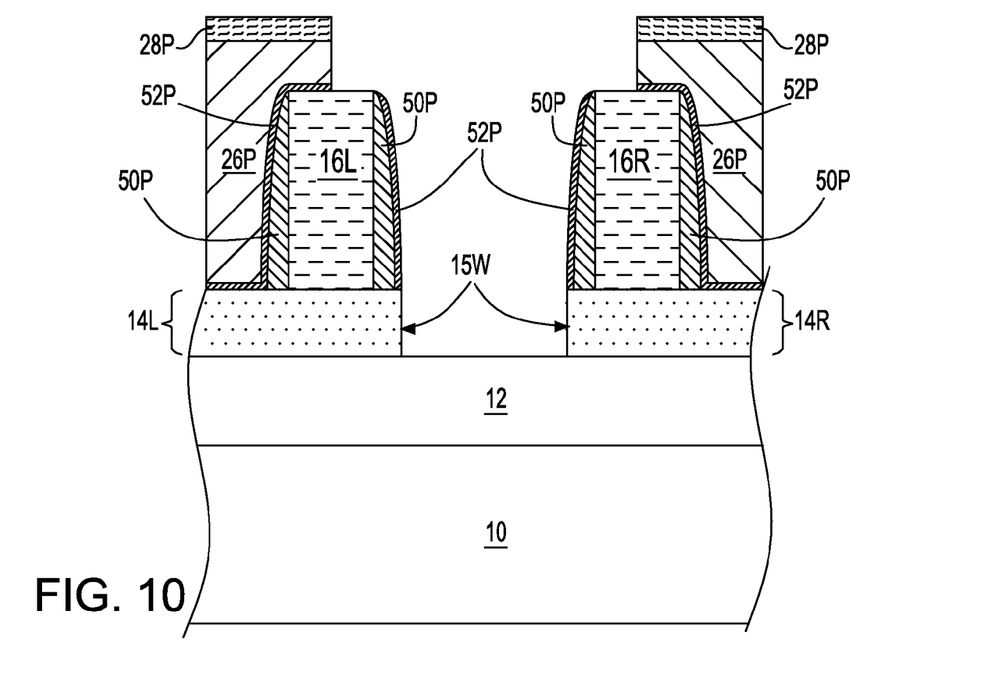
FIG. 10 is a cross sectional view of the exemplary semiconductor structure of FIG. 9 after cutting the semiconductor fin utilizing the patterned material stack, one gate spacer of the first set of gate spacers and a remaining portion of the sacrificial dielectric liner as an etch mask.

Referring now to FIG. 10, there is illustrated the exemplary semiconductor structure of FIG. 9 after cutting the semiconductor fin 14P utilizing the patterned material stack (26P, 28P), one of the first gate spacers 50P (within opening 30) and a remaining portion of the sacrificial dielectric liner (i.e., sacrificial dielectric liner portion 52P) as an etch mask. The cutting of the semiconductor fin 14P, which provides semiconductor fin portions 14L, 14R, may be performed utilizing an anisotropic etch that is selective in removing the semiconductor material that provides the semiconductor fin 14P. The cutting of the semiconductor fin 14P exposes an end wall 15W of each remaining semiconductor fin portion 14L, 14R. In some embodiments, each end wall 15W is vertically aligned to a sidewall of the sacrificial dielectric liner portions 52P located within opening 30. In accordance with the present application, the end wall 15W of semiconductor fin portion 14L faces the end wall 15W of semiconductor fin portion 14R.

Figure 11:
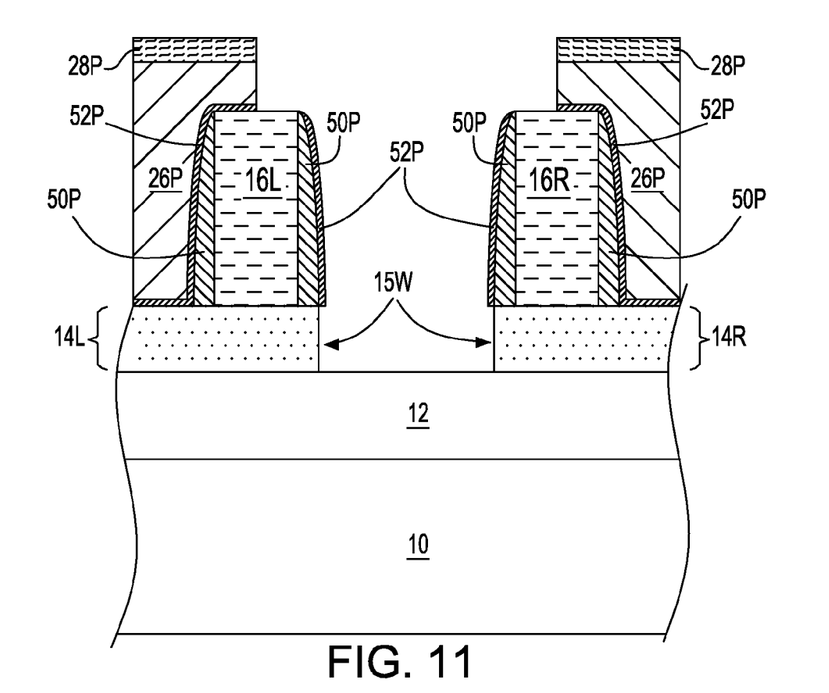
FIG. 11 is a cross sectional view of the exemplary semiconductor structure of FIG. 10 after performing a lateral etch to pull back an end wall of each cut semiconductor fin.

Referring now to FIG. 11, there is illustrated the exemplary semiconductor structure of FIG. 10 after performing a lateral etch to pull back the end wall of each semiconductor fin portion 14L, 14R. The lateral etch provides an undercut region beneath one of the sacrificial dielectric liner portions 52P so that the end wall 15W is either underneath one of the first gate spacers 50P or is vertically aligned to a sidewall of one gate spacer of the first set of gate spacers 50P that is located within the opening 30. The lateral etch comprises a wet or dry isotropic chemical etch.

Figure 12:
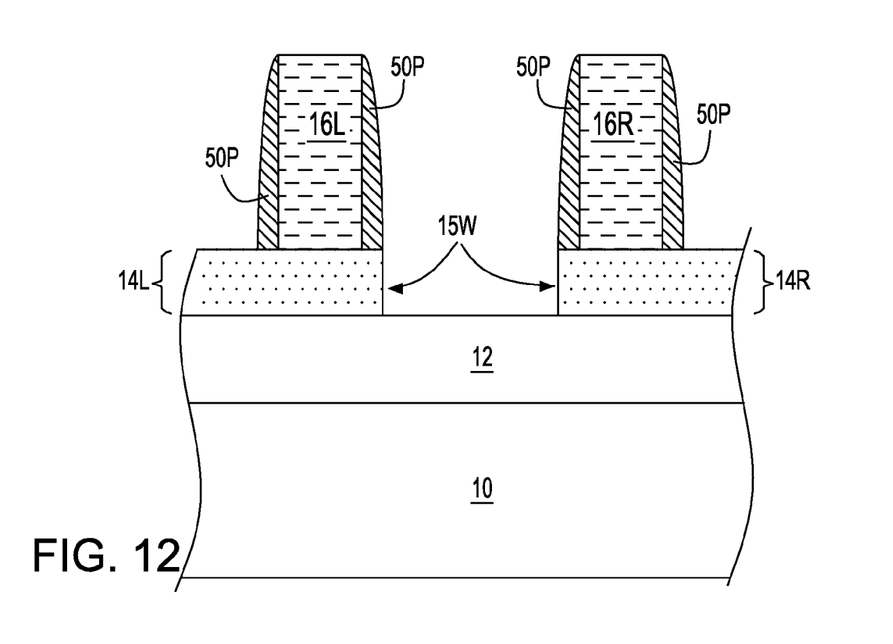
FIG. 12 is a cross sectional view of the exemplary semiconductor structure of FIG. 11 after removing the patterned material stack and the remaining portion of the sacrificial dielectric liner.

Referring now to FIG. 12, there is illustrated the exemplary semiconductor structure of FIG. 11 after removing patterned material stack (26P, 28P) and then remaining portions of the sacrificial dielectric liner (i.e., sacrificial dielectric liner portion 52P). The patterned material stack (26P, 28P) can be removed as described above in the previous embodiment of the present application. Each sacrificial dielectric liner portion 52P can be removed utilizing an etch that is selective in removing the dielectric material that provides each sacrificial dielectric liner portion 52P.

Figure 13:
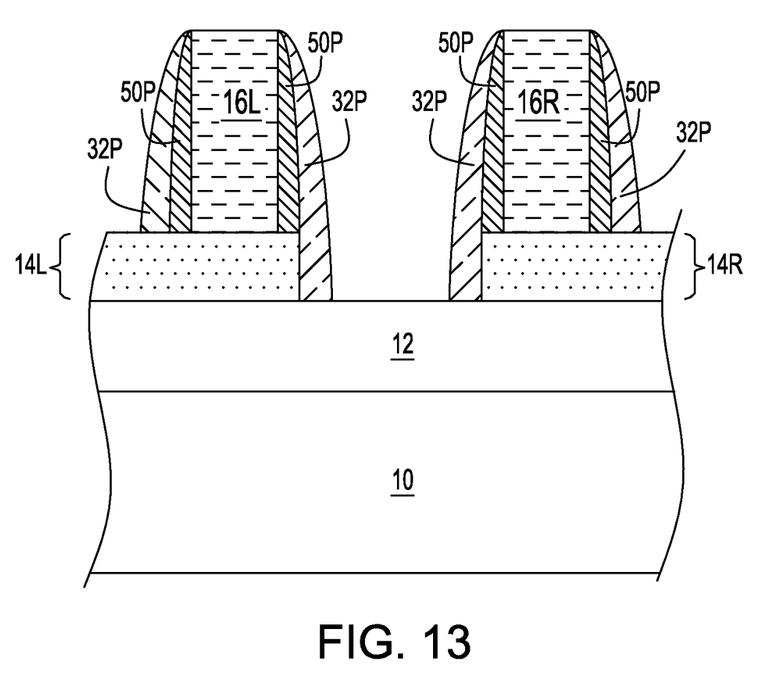
FIG. 13 is a cross sectional view of the exemplary semiconductor structure of FIG. 12 after forming a second set of gate spacers.

Referring now to FIG. 13, there is illustrated the exemplary semiconductor structure of FIG. 12 after forming a second set of gate spacers 32P. The second set of gate spacers 32P that are used in this embodiment of the present application include one of the dielectric materials mentioned above for providing the second set of gate spacers 32P in the previous embodiment of the present application. The second set of gate spacers 32P can be formed by deposition, followed by a spacer etch. The second set of gate spacers 32P is formed on exposed sidewalls of the first set of gate spacers 50P and a portion of each semiconductor fin portion 14L, 14R. As is shown, one of the gate spacers of the second set of gate spacer 32P that is located at the end of the semiconductor fin portions 14L, 14R covers exposed sidewalls of the semiconductor fin portions 14L, 14R. The other gate spacer of the second set of gate spacer 32P that is located on the side of the gate structure 16L, 16R opposite the side in which the semiconductor fin was cut, straddles the semiconductor fin portion 14L, 14R.

Source/drain regions (not shown) are formed on exposed portions of the semiconductor fin portion 14L, 14R that are not covered by the gate structures 16L, 16R. The source/drain regions can be formed utilizing conventional techniques such as, for example, epitaxial growth, which are well known to those skilled in the art. As is known, the source region would be located on one side of the functional gate structure and the drain region would be located on another side of the functional gate structures. In some embodiments, the source/drain regions can be unmerged. In yet other embodiments, the source/drain regions can be merged. The source/drain regions comprise a semiconductor material and an n-type or p-type dopant. In some embodiments, the source/drain regions may comprise a same semiconductor material as that of the semiconductor fin portions 14L, 14R. In some embodiments, the source/drain regions may comprise a different semiconductor material as that of the semiconductor fin portions 14L, 14R. In some embodiments, and when a sacrificial gate structure is formed, the sacrificial gate structure can now be replaced with a functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a semiconductor fin portion having an end wall and extending upwards from a substrate;
    a gate structure straddling a portion of said semiconductor fin portion;
    a first set of gate spacers located on opposing sidewall surfaces of said gate structure; and
    a second set of gate spacers located on outer sidewalls of said first gate spacers, wherein one gate spacer of said second set of gate spacers has an inner sidewall surface having an upper portion directly contacting said outer sidewall of one of said gate spacers of said first set of gate spacers and a lower portion directly contacting and covering an entirety of a sidewall of said end wall of said semiconductor fin portion.

2. The semiconductor structure of claim 1, wherein said gate structure is a functional gate structure.

3. The semiconductor structure of claim 2, wherein each gate spacer of said first set of gate spacers is only located on a topmost surface of said semiconductor fin portion, and wherein one gate spacer of said first set of gate spacers has an outer edge that is vertically aligned to said sidewall of said end wall of said semiconductor fin portion.

4. The semiconductor structure of claim 3, wherein another gate spacer of said second set of gate spacers straddles over said topmost surface of said semiconductor fin portion.

5. The semiconductor structure of claim 2, wherein each gate spacer of said first set of gate spacers straddles over said semiconductor fin portion.

6. The semiconductor structure of claim 5, wherein another gate spacer of said second set of gate spacers straddles another portion of said semiconductor fin portion.

7. The semiconductor structure of claim 1, wherein said substrate is an insulator layer.

8. The semiconductor structure of claim 1, wherein said first set of gate spacers comprises a same dielectric material as said second set of gate spacers.

9. The semiconductor structure of claim 1, wherein said first set of gate spacers comprise a different dielectric material than said second set of gate spacers.

10. The semiconductor structure of claim 1, wherein at least one gate spacer of said first set of gate spacers or said second set of gate spacers is composed of a SiBCN or SiOCN material.

11. The semiconductor structure of claim 1, wherein one gate spacer of said first set of gate spacers has an outer surface that is vertically aligned with said sidewall surface of said end wall of said semiconductor fin portion.

12. The semiconductor structure of claim 1, wherein a bottommost surface of each gate spacer of said second set of gate spacers is coplanar with a bottommost surface of said semiconductor fin portion.

\* \* \* \* \*